United States Patent [19]
Freimuth

[11] Patent Number: 6,034,913
[45] Date of Patent: Mar. 7, 2000

[54] APPARATUS AND METHOD FOR HIGH-SPEED WORDLINE DRIVING WITH LOW AREA OVERHEAD

[75] Inventor: Franz Freimuth, Williston, Vt.

[73] Assignee: Siemens Microelectronics, Inc., Cupertino, Calif.

[21] Appl. No.: 08/932,925

[22] Filed: Sep. 19, 1997

[51] Int. Cl.[7] .................................................. G11C 8/00
[52] U.S. Cl. .............................. 365/230.06; 365/189.07; 365/189.11
[58] Field of Search ....................... 365/230.06, 189.06, 365/189.11, 189.07

[56] References Cited

U.S. PATENT DOCUMENTS

| 4,291,392 | 9/1981 | Prebsting ................................. 365/203 |
| 4,397,003 | 8/1983 | Wilson et al. ........................... 365/205 |
| 4,563,754 | 1/1986 | Aoyama et al. ......................... 365/190 |
| 4,901,280 | 2/1990 | Patel ....................................... 365/189.11 |
| 5,381,377 | 1/1995 | Bewick et al. ......................... 365/189.06 |
| 5,590,079 | 12/1996 | Lee et al. .............................. 365/230.06 |
| 5,631,869 | 5/1997 | Ninimiya et al. ..................... 365/230.06 |
| 5,761,135 | 6/1998 | Lee ........................................ 365/189.11 |
| 5,761,149 | 6/1998 | Suzuki et al. ......................... 365/230.03 |

Primary Examiner—David Nelms
Assistant Examiner—Tuan T. Nguyen
Attorney, Agent, or Firm—Stanton C. Braden

[57] ABSTRACT

Improved techniques for driving wordlines of a semiconductor memory device are described. Accordingly to the invention, a wordline 402 is driven by a wordline driver 406 at a first end and then provided with a small amount of additional circuitry 442 at the other end of the wordline. When the additional circuitry senses that the wordline is beginning to transition to an active state, the additional circuitry operates to assist or accelerate the transition of the wordline to the active state. Accordingly, the invention operates to rapidly transition wordlines to an active state while using only minimal amounts of die area. The invention is particularly well suited for dynamic random access memories.

18 Claims, 4 Drawing Sheets

APPARATUS AND METHOD FOR HIGH-SPEED WORDLINE DRIVING WITH LOW AREA OVERHEAD

BACKGROUND OF THE INVENTION

1. Field of the Invention

The present invention relates to semiconductor memory devices. More particularly, the invention relates to improved wordline driving for semiconductor memory devices.

2. Description of the Related Art

In a typical dynamic random access memory (DRAM) integrated circuit design for a semiconductor memory device, a memory array is configured with wordlines and bitlines running in an orthogonal manner. The memory array includes a large number of memory cells placed at the intersection of each wordline and bitline. Each memory cell is formed from a single transistor and a capacitive storage element.

FIG. 1 is a schematic diagram of a basic DRAM memory cell 100 for a DRAM integrated circuit. The basic DRAM memory cell 100 includes a cell transistor 102 and a capacitive storage element 104. The cell transistor 102 couples to a wordline (WL) 106 and a bitline (BL) 108 of the DRAM integrated circuit. The gate of the cell transistor 102 is connected to the wordline (WL) 106. The transistor 102 also has a first channel terminal and a second channel terminal. The first channel terminal of the cell transistor 102 is connected to the bitline (BL) 108 and the second channel terminal of the cell transistor 102 is connected to a first side of the capacitive storage element 104. The second side of the capacitive storage element 104 is connected to a supply voltage $V_C$.

Typically, the wordlines for the memory cells of a DRAM integrated circuit are driven from one side of the memory array by wordline drivers. However, with the ever increasing size and density of DRAM integrated circuit designs, the number of the memory cells coupled to a given wordline is continually increasing. As a result, the wordlines in a DRAM integrated circuit are heavily loaded by parasitic capacitance. The parasitic capacitance on the wordlines makes it difficult to transition the wordlines at high speed and thus operate the DRAM integrated circuit at high speed.

FIG. 2 is a block diagram of a conventional DRAM integrated circuit 200. The DRAM integrated circuit 200 includes a memory array 202, a row decoder 204 and a column decoder 206. The memory array 202 includes an array of memory cells such as depicted in FIG. 1. The memory cells are addressed individually by a row and column combination. The row is selected by the row decoder 204 in accordance with a row address 208. The column is selected by the column decoder 206 in accordance with a column address 210. The data to be stored at the addressed memory cell is either provided to the column decoder 206 by a data bus 212 or output by the column decoder 206 over the data bus 212. In any event, conventionally the row decoder 204 operates to select a wordline then causes the selected wordline to be activated. However, as noted above, since the number of memory cells coupled to a particular wordline is numerous, the parasitic capacitance makes it difficult to rapidly transition the selected wordline.

One approach to driving the wordlines at faster speeds operates to increase the driving ability of the wordline drivers provided at one end of the wordlines. Generally, the size of the wordline drivers are increased to provide the increase in driving ability. This approach is generally effective but the die area penalty is rather severe for the improvement in performance provided. Another approach would be to provide a second set of row decoder circuits, drivers and associated wiring so that the wordlines could be driven from both ends. Again, the die area penalty for such a design renders it impractical to implement in most semiconductor memory designs.

Thus, there is a need for improved techniques to drive wordlines within semiconductor memory devices.

SUMMARY OF THE INVENTION

Broadly speaking, the invention relates to improved techniques for driving wordlines of a semiconductor memory device. According to the invention, a wordline is driven by a wordline driver at a first end and then provided with a small amount of additional circuitry at the other end of the wordline. When the additional circuitry senses that the wordline is beginning to transition to an active state, the additional circuitry operates to assist or accelerate the transition of the wordline to the active state. Accordingly, the invention operates to rapidly transition wordlines to an active state while using only minimal amounts of die area. The invention is particularly well suited for dynamic random access memories.

The invention can be implemented in numerous ways, including as an apparatus, a circuit, and a method. Several embodiments of the invention are discussed below.

As a dynamic random access memory, an embodiment of the invention includes: a memory array having an array of memory cells, a plurality of bitlines, and a plurality of wordlines; an address decoder for receiving an address for a data request and selecting one of the plurality of wordlines and one of a plurality of bitlines, the selected wordline having a first side and a second side; a line driver for driving the selected wordline at the first side; and a line transition accelerator circuit for detecting an initial part of a transition in a first direction on the selected wordline and then accelerating a remaining part of the transition on the selected wordline in the first direction from the second side.

Optionally, the line transition accelerator circuit includes: a level sense circuit coupled to the selected wordline, and a switch circuit coupled to the selected wordline. The level sense circuit monitors a voltage level on the selected wordline to produce a voltage level signal. The switch circuit operates to pull the selected wordline towards a predetermined supply potential based on the voltage level signal.

As a semiconductor memory device, an embodiment of the invention includes: a memory array having an array of memory cells, a plurality of bitlines, and a plurality of wordlines; a wordline driver for each of the wordlines; monitoring means for determining that at least one of the wordlines is beginning to transition from an inactive state to an active state; and assistance means for assisting the wordline driver associated with the one of the wordlines that is beginning to transition, the assistance means operates to assist in driving the transition of the one of the wordlines that is beginning to transition from the inactive state to the active state.

As a method for activating a wordline in a semiconductor memory device having a plurality of wordlines with memory cells coupled thereto, an embodiment of the invention includes the operations of receiving a control signal having one of an enable state and a disable state; monitoring a wordline; determining whether the monitored wordline is beginning to transition from a first logic level to a second logic level; and pulling the monitored wordline to the second level when both the control signal has the enable state and the determining determines that the monitored wordline has begun to transition from the first logic level to the second logic level.

The advantages of the invention are numerous. One advantage of the invention is that wordline switching (e.g., activation) is made faster with only a minimal amount of additional circuitry and die area requirements. Another advantage of the invention is that wordlines are able to handle more memory cells in a memory array (i.e., denser memory arrays) because of the more robust switching provided by the invention.

Other aspects and advantages of the invention will become apparent from the following detailed description, taken in conjunction with the accompanying drawings, illustrating by way of example the principles of the invention.

BRIEF DESCRIPTION OF THE DRAWINGS

The present invention will be readily understood by the following detailed description in conjunction with the accompanying drawings, wherein like reference numerals designate like structural elements, and in which.

DETAILED DESCRIPTION OF THE INVENTION

The invention relates to improved techniques for driving wordlines of a semiconductor memory integrated circuit (IC). Such a memory IC includes a random access memory (RAM), a dynamic random access memory (DRAM), a synchronous DRAM (SDRAM) and merged DRAM-logic (embedded DRAM). Additionally, an IC such as an application specific integrated circuit (ASIC) or any logic circuit where heavily loaded lines get driven is also useful. Typically, a plurality of ICs are formed on the wafer in parallel. After processing is finish, the wafer is diced to separate the ICs to individual chips. The chips are then packaged, resulting in a final product that is used in, for example, consumer products such as computer systems, cellular phones, personal digital assistants (PDAs), and other electronic products.

According to the invention, a wordline is driven by a wordline driver at a first end and then provided with a small amount of additional circuitry at the other end of the wordline. When the additional circuitry senses that the wordline is beginning to transition to an active state, the additional circuitry operates to assist or accelerate the transition of the wordline to the active state. Accordingly, the invention operates to rapidly transition wordlines to an active state while using only minimal amounts of die area. The invention is particularly well suited for dynamic random access memories.

Embodiments of the invention are discussed below with reference to FIGS. 3–6. However, those skilled in the art will readily appreciate that the detailed description given herein with respect to these figures is for explanatory purposes as the invention extends beyond these limited embodiments.

Figure 1:
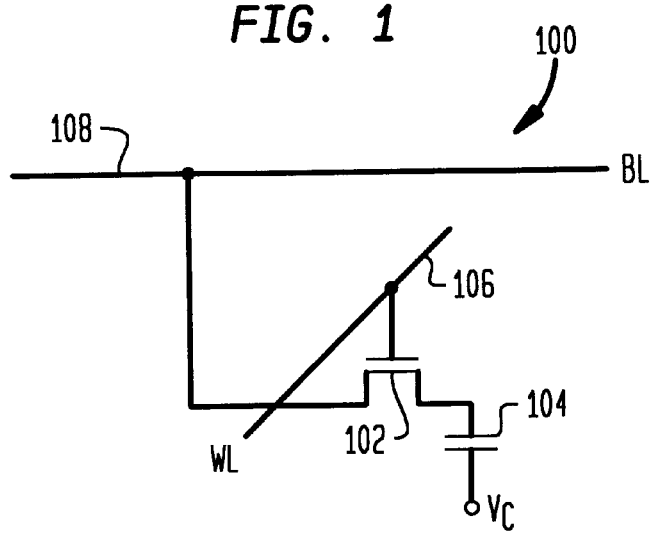
FIG. 1 is a schematic diagram of a basic DRAM memory cell for a DRAM integrated circuit.
Figure 2:
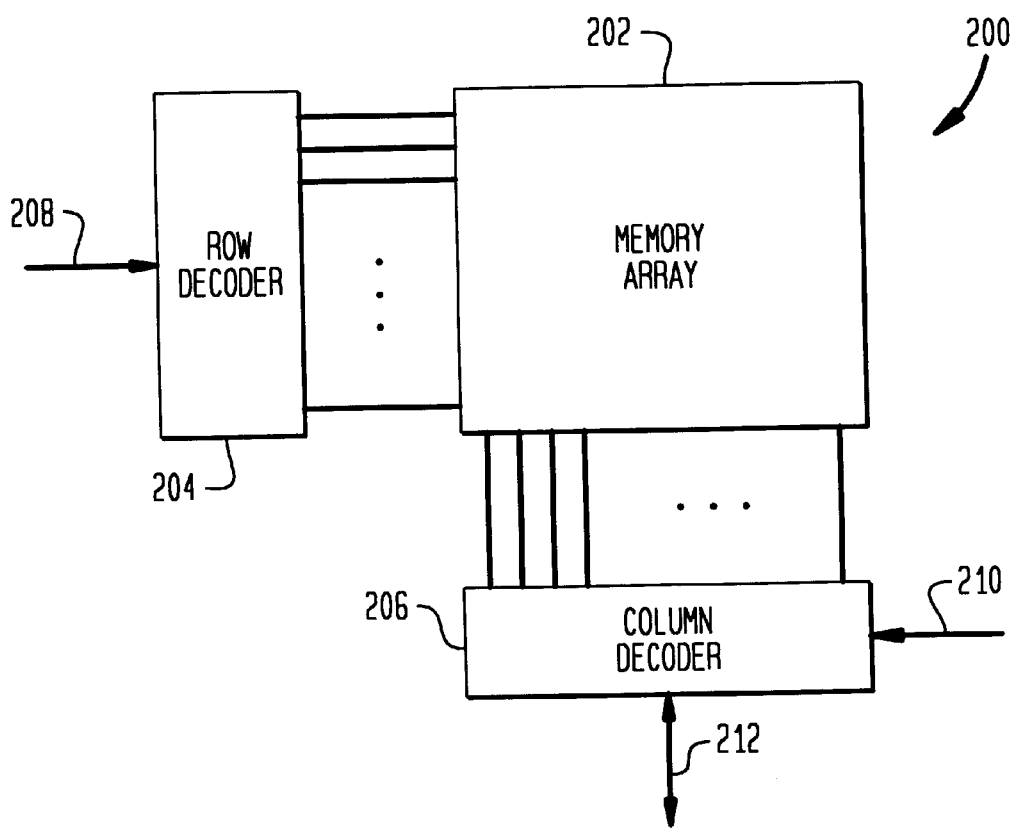
FIG. 2 is a block diagram of a conventional DRAM integrated circuit.
Figure 3:
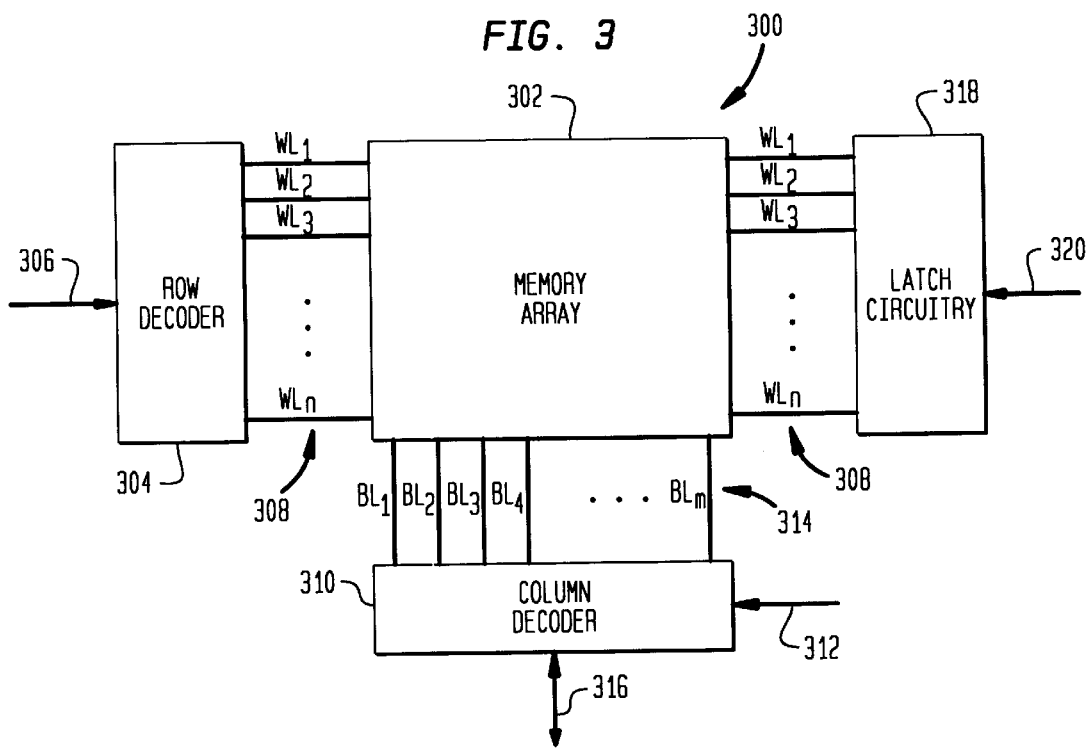
FIG. 3 is a block diagram of a DRAM semiconductor memory circuit according to an embodiment of the invention.

FIG. 3 is a block diagram of a semiconductor memory circuit 300 according to an embodiment of the invention. The semiconductor memory is, for example, a DRAM circuit. The DRAM semiconductor memory circuit 300 includes a memory array 302 that includes a plurality of memory cells arranged in an array configuration. The individual memory cells can be selected through a combination of a selected wordline and a selected bitline. A row decoder 304 receives a row address signal 306 and selects one of a plurality of wordlines ($WL_1$–$WL_n$) 308. The column decoder 310 receives a column address signal 312 illustrated in FIG. 3 and selects one of a plurality of bitlines ($BL_1$–$Bl_m$) 314. Additionally, data is supplied to or read from a selected memory cell of the memory array 302 by a data bus 316 coupled to the column decoder 310.

The DRAM semiconductor memory circuit 300 also includes latch circuitry 318. The latch circuitry 318 couples to the wordlines ($WL_1$–$WL_n$) 308 of the memory array 302. The latch circuitry 318 also receives a control signal 320 that operates to control when the latch circuitry 318 is permitted to perform a latching operation. The latching operation performed by the latch circuitry 318 is individually on each of the wordlines ($WL_1$–$WL_n$) 308 and operates to accelerate the transition of the selected wordline (WL) so that the DRAM semiconductor memory circuit 300 can operate at faster speeds. Only one of the wordlines ($WL_1$–$WL_n$) 308 is normally transitioning at any point in time.

Although the latch circuitry 318 illustrated in FIG. 3 is shown as being separate from the memory array 302, the latch circuitry 318 is preferably integrated within the memory array 302. One advantage of providing the latch circuitry 318 integral to the memory array 302 is that the connections of the latch circuitry 318 to the wordlines is facilitated.

Figure 4:
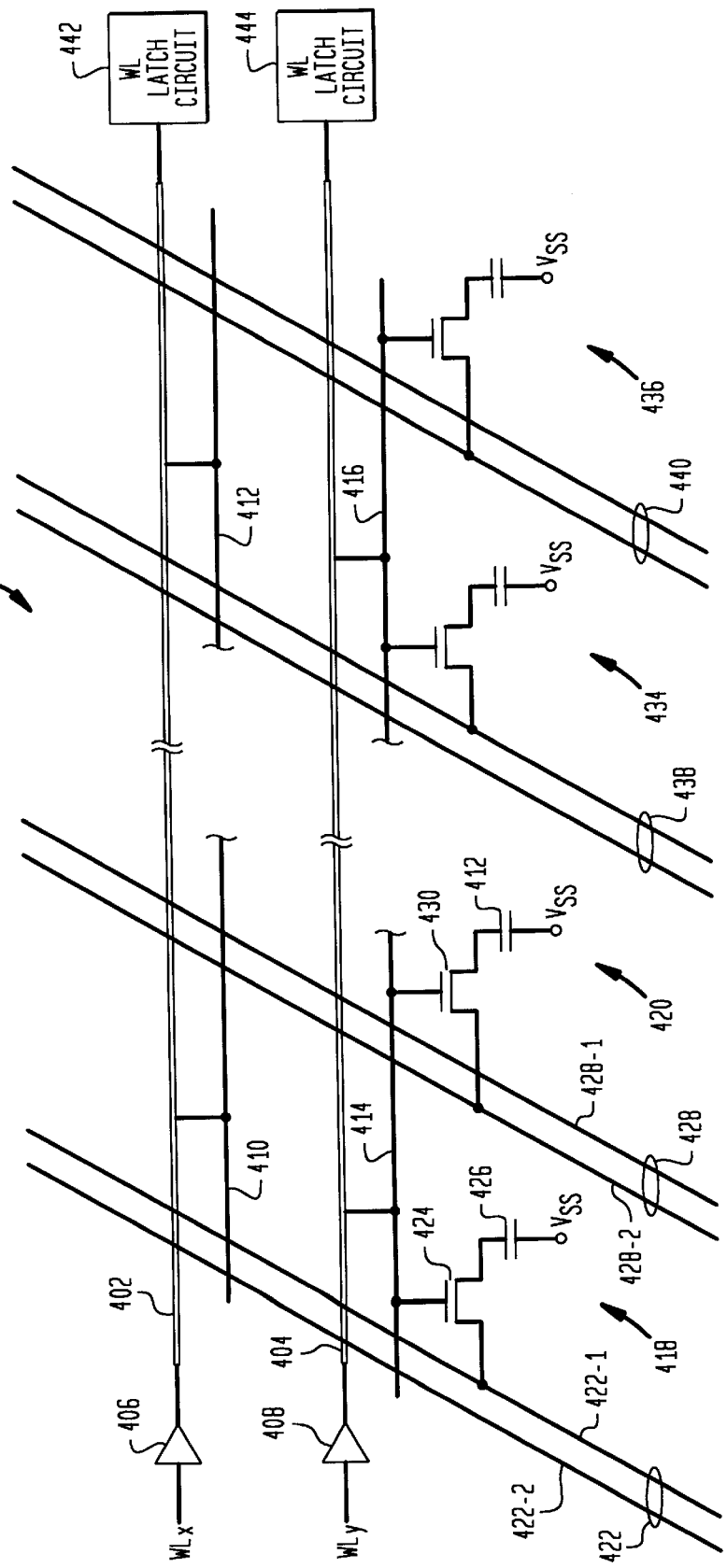
FIG. 4 illustrates a memory array according to an embodiment of the invention.

FIG. 4 illustrates a memory array 400 according to an embodiment of the invention. The memory array 400 includes wordlines, bitlines and memory cells of a memory array as well as latch circuits for accelerated operation. More specifically, the memory array 400 illustrated in FIG. 4 shows a portion of a memory array of a semiconductor memory device. The portion illustrated in FIG. 4 contains two wordlines $WL_x$ and $WL_y$ and various bitlines.

The memory array 400 includes metal wordlines 402 and 404. The metal wordline 402 is driven by a wordline driver 406 and coupled to wordline $WL_x$, and the metal wordline 404 is driven by a wordline driver 408 and coupled to the wordline $WL_y$. In order to keep the line resistance of the metal wordlines relatively low, the metal wordlines are metal lines that are sometimes stitched frequently to poly-silicon segments that run in parallel and underneath the metal wordlines. In particular, the metal wordline 402 has poly-silicon segments 410 and 412 running in parallel underneath the metal wordline. Likewise, the metal wordline 404 has poly-silicon segments 414 and 416 running in parallel underneath the metal wordline 414. As an example, a single metal wordline might have eight (8) poly-silicon segments.

The memory array 400 also includes metal bitline pairs that intersect the metal wordlines. Such a configuration is referred to as a folded-bitline architecture. Other bitline configurations, such as open or open-folder, are also useful.

Illustratively, the bitlines are orthogonal to the metal wordlines. Intersections of the bitlines to the wordlines at angles other than 90° are also useful. Memory cells, such as memory cells 418 and 420, are provided at the intersection of each metal wordline and metal bitline. A first bitline 422-1 of a first pair of metal bitlines 422 couples to a first channel terminal of a cell transistor 424. A second channel terminal of the cell transistor 424 is coupled to a first side of a capacitive storage element 426. A second side of the capacitive storage element 426 is coupled to supply voltage ($V_{SS}$). The gate of the cell transistor 424 couples to the associated poly-silicon segment 414. Likewise, for all of the other metal wordlines within the memory array 400, a like storage cell is provided and coupled to the first bitline 422-1 of the bitline pair 422 in a similar manner.

For a second pair of metal bitlines 428, a second bitline 428-2 of the bitline pair 428 couples to a first channel terminal of a cell transistor 430. The second channel terminal of the cell transistor 430 is coupled to a first side of a capacitive storage element 432. A second side of the capacitive storage element 432 is connected to supply voltage ($V_{SS}$). The gate of the cell transistor 430 couples to the associated poly-silicon segment 414. Likewise, for all of the other metal wordlines within the memory array 400, a like storage cell is provided and coupled to the second bitline 428-2 of the bitline pair 428.

Additionally, the memory array 400 includes other metal bitline pairs, such as bitline pairs 438 and 440. These bitline pairs 438 and 440 similarly include memory cells 434 and 436, respectively, for each wordline.

Furthermore, each of the wordlines within the memory array 400 include a wordline latch circuit. In particular, the metal wordline 402 is coupled to a wordline latch circuit 444, and the metal wordline 404 is coupled to a wordline latch circuit 442. In one embodiment, the wordline driver 406 is coupled to a first end of the associated metal wordline 402 and the wordline latch circuit 442 is coupled to a second end of the associated metal wordline 402. Also, the wordline driver 408 is coupled to a first end of the associated metal wordline 404 and the wordline latch circuit 444 is coupled to a second end of the associated metal wordline 404.

The wordline latch circuits 442 and 444 represent individual circuit portions of the latch circuitry 318 illustrated in FIG. 3. The structure and operation of the wordline latch circuits 442 and 444 are described in detail below with respect to FIGS. 5 and 6.

Figure 5:
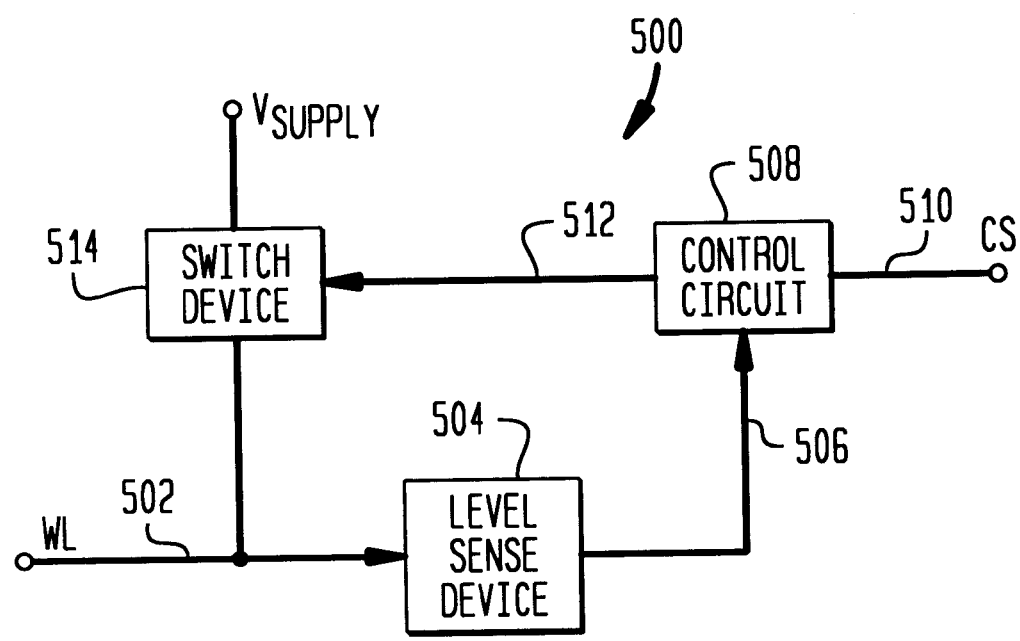
FIG. 5 is a block diagram of a wordline latch circuit according to an embodiment of the invention.

FIG. 5 is a block diagram of a wordline latch circuit 500 according to an embodiment of the invention. The wordline latch circuit 500 receives a wordline (WL) 502 at an input to a level sense device 504. The level sense device 504 operates to monitor a signal level (e.g., voltage) on the wordline (WL) 502. In this embodiment, the signal level is assumed to be a voltage level. When the level sense device 504 determines that the voltage level on the wordline (WL) 502 has exceeded a threshold voltage amount, a voltage level signal 506 informs a control circuit 508 that the wordline (WL) 502 has begun to transition from a first logic state (e.g., 0 volts) to a second logic level (e.g., $V_{DD}$).

The control circuit 508 receives the voltage level signal 506 and also receives a control signal 510. A control signal 510 is provided to the wordline latch circuit 500 to enable the wordline latch circuit 500. When the wordline latch circuit 500 is enabled, the wordline latch circuit 500 is permitted to perform its latching operation. On the other hand, when the wordline latch circuit 500 is disabled, then the wordline latch circuit 500 is not able to perform its latching operation. Moreover, when the wordline latch circuit 500 is disabled, the semiconductor memory device is not negatively impacted by the presence of the wordline latch circuit 500.

When the control circuit 508 determines that the voltage level signal 506 indicates that the wordline (WL) 502 has begun to transition and that the control signal 510 has enabled (authorized) its latching operation, then the control circuit 508 produces a control signal 512 that causes a switch device 514 to electrically couple the wordline (WL) 502 to a supply potential ($V_{SUPPLY}$). When the switch device 514 is activated to electrically couple the wordline (WL) 502 to the supply potential ($V_{SUPPLY}$), the transitioning of the wordline (WL) 502 that has begun and detected by the level sense device 504 is assisted so that the transition of the wordline (WL) 502 can complete faster than otherwise possible if the semiconductor memory device did not include the wordline latch circuit 500. For example, in one embodiment, when the switch device 514 is activated to electrically couple the wordline (WL) 502 to the supply potential ($V_{SUPPLY}$), the wordline (WL) 502 is "pulled up" from its existing voltage level to the supply potential ($V_{SUPPLY}$). On the other hand, when the control circuit 508 determines that either the control signal 510 is disabling the wordline latch circuit 500 (i.e., does not authorize its latching operation) or that the voltage level signal 506 does not indicate that the wordline (WL) 502 has begun to transition, the control signal 512 causes the switch device 514 to isolate the supply potential ($V_{SUPPLY}$) from the wordline (WL) 502.

Figure 6:
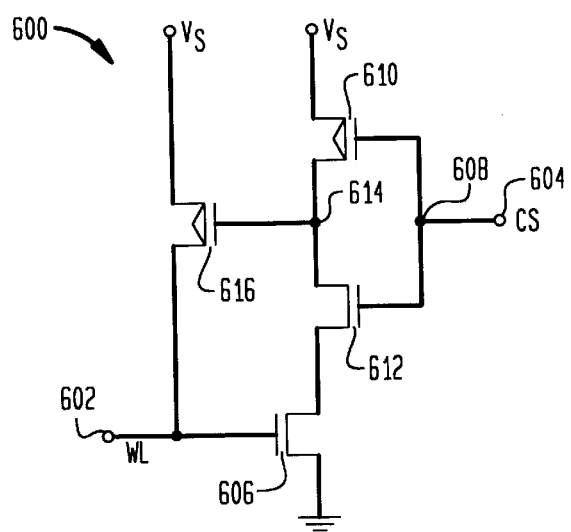
FIG. 6 is a schematic diagram of a latch circuit according to an embodiment of the invention.

FIG. 6 is a schematic diagram of a latch circuit 600 according to an embodiment of the invention. The latch circuit 600 is one suitable implementation of the wordline latch circuits 442 and 444 illustrated in FIG. 4. The latch circuit 600 is also a suitable implementation of the latch circuit 500 illustrated in FIG. 5.

The latch circuit 600 couples to a wordline (WL) 602 and receives a control signal (CS) 604. The wordline (WL) 602 couples to a gate of a first transistor 606. The first transistor 606 is preferably a low threshold device. The control signal (CS) 604 is received at a first node 608 of the latch circuit 600. The latch circuit 600 also includes a second transistor 610 and a third transistor 612. The gate terminals of both the second transistor 610 and the third transistor 612 are coupled to the first node 608. A first channel terminal of the second transistor 610 is connected to a first supply potential ($V_S$), and a second channel terminal of the second transistor 610 is connected to a second node 614 of the latch circuit 600. A first channel terminal of the third transistor 612 is connected to the second node 614, and a second channel terminal of the third transistor 612 is connected to a first channel terminal of the first transistor 606. The second channel terminal for the first transistor 606 is connected to a second supply potential (GND). The latch circuit 600 also includes a fourth transistor 616. A gate terminal for the fourth transistor 616 is connected to the second node 614. A first channel terminal for the fourth transistor 616 is connected to the first supply potential ($V_S$), and a second channel terminal is connected to the wordline (WL) 602.

In the latch circuit 600 illustrated in FIG. 6, the first transistor 606 and the third transistor 612 are n-type field-effect transistors, and the second transistor 610 and the fourth transistor 616 are p-type field-effect transistors. The latch circuit 600 is also designed to "pull-up" the wordline (WL) 602 when the wordline (WL) 602 is being activated (i.e., when the wordline (WL) 602 is transitioning to active state). In other words, in this embodiment it is assumed that the wordline (WL) 602 is activated at a high logic level and inactive at a low logic level. The latch circuit 600 thus operates to "pull-up" the wordline (WL) 602 from the low logic level to the high logic level once it has been determined that the wordline (WL) has begun to transition to the active state. As a result, the wordline (WL) 602 is able to transition rapidly even in the presence of significant amounts of parasitic capacitance on the wordline (WL) 602.

In an alternative embodiment, the wordline (WL) could be "pulled-down" to a low logic level in a situation in which it was desirable to rapidly transition the wordline (WL) from a high logic level to a low logic level. Such would be the case in a memory array configuration in which the wordline (WL) were active at a low logic level. In any event, the alternative embodiment would be similar to the latch circuit 600 but modified such that the n-type devices would be replaced by p-type devices and the supply potentials would be reversed.

The control signal 604 is preferably used to enable the latch circuit 600 just prior to the wordline (WL) being activated. Further, the control signal 604 is then preferably subsequently removed after the latch circuit 600 is no longer required to assist with the transition of the wordline. In other words, the latch circuit 600 should be activated only during wordline rise. It is advantageous that the latch circuitry be disabled as soon as it is no longer needed to assist with the wordline (WL) transition because a capacitive coupling effect with neighboring wordlines could possibly trigger adjacent latch circuits and cause them to erroneously "pull-up" other wordlines since the second nodes 614 are floating in this condition. As an example, the floating of the second node 614 for up to about 7 ns has shown to be tolerable in a 64 megabit DRAM integrated circuit design.

Further, the threshold voltage for the first transistor 606 should be set such that accidental triggering due to noise is avoided. For example, a wordline might have about 200 mV (millivolts) of noise present, so the voltage threshold used by the latch circuit might be set at a value of 400 mV or more. However, one should also take care to factor in process variations with respect to the threshold voltages. As an example, in the latch circuit 600 illustrated in FIG. 6, the transistor 606 would preferably be a low threshold device with its threshold voltage set at a suitable value, such as 400 mV. Once the wordline is "pulled-up" by the latch circuit 600 together with driving provided by the wordline driver, the voltage of the wordline would level out at about the supply voltage (e.g., 3.5 Volts).

As driving always is a trade-off between device size and speed, many variations are conceivable on how to take advantage of the benefits from the invention. Hence, the exact construction of the circuitry for providing the improved wordline switching according to the invention depends largely upon a particular design. Also, if array efficiency is a concern, the invention facilitates implementation of longer wordlines before resistance-capacitance (RC) becomes a limiting factor. In contrast, with conventional single-sided driving, the wordline gets RC limited beyond a certain length, and an increase in driver device size has no or only marginal impact on wordline risetime.

The advantages of the invention are faster wordline switching with only a minimal amount of additional circuitry and die area requirements. In comparison, to provide circuitry for a complete second row decoder, the are savings is significant, for example, perhaps as much as 90% less die area. Another advantage of the invention is that wordlines are able to handle more memory cells in a memory array (i.e., denser memory arrays) because of the more robust switching provided by the invention.

The many features and advantages of the present invention are apparent from the written description, and thus, it is intended by the appended claims to cover all such features and advantages of the invention. Further, since numerous modifications and changes will readily occur to those skilled in the art, it is not desired to limit the invention to the exact construction and operation as illustrated and described. Hence, all suitable modifications and equivalents may be resorted to as falling within the scope of the invention.

What is claimed is:

1. A dynamic random access memory, comprising:
   a memory array having an array of memory cells, a plurality of bitlines, and a plurality of wordlines;
   an address decoder, said address decoder receives an address for a data request and selects one of the plurality of wordlines and one of he plurality of bitlines, the selected wordline having a first side and a second side;
   a line driver for driving the selected wordline at the first side; and
   a line transition accelerator circuit for detecting an initial part of a transition in a first direction on the selected wordline and then accelerating a remaining part of the transition on the selected wordline in the first direction from the second side, said line transition accelerator circuit includes at least:
   a level sense circuit coupled to the selected wordline, said level sense circuit monitors a voltage level on the selected wordline to produce a voltage level signal; and
   a single transistor switch circuit including a single switching transistor coupled between the selected wordline and a predetermined supply potential, said single switching transistor operates to pull the selected wordline towards the predetermined supply potential based on the voltage level signal, and said line transition acceleration circuit does not include any other transistors between the selected wordline and the predetermined supply potential.

2. A dynamic random access memory as recited in claim 1, wherein, based on the voltage level signal, said single transistor switch circuit operates to either pull the selected wordline towards the predetermined supply potential or isolate the selected wordline from the predetermined supply potential.

3. A dynamic random access memory as recited in claim 1,
   wherein said line transition accelerator circuit further comprises:
   a control circuit operatively connected between said level sense circuit and a gate terminal of said single switching transistor, said control circuit receives the voltage level signal from said level sense circuit and produces a control signal for the gate terminal of said single switching transistor of said switch circuit, and
   wherein, based on the control signal, said single switching transistor operates to either pull the selected wordline towards the predetermined supply potential or isolate the selected wordline from the predetermined supply potential.

4. A dynamic random access memory as recited in claim 3, wherein said control circuit also receives an enable signal for said line transition accelerator circuit, and the control signal is produced based on both the voltage level signal and the enable signal.

5. A dynamic random access memory as recited in claim 4, wherein the enable signal limits the duration for which said switch circuit is able to pull the selected wordline towards the predetermined supply potential.

6. A dynamic random access memory as recited in claim 3, wherein said level sense circuit comprises:
   a first field effect transistor having a gate terminal coupled to the selected wordline, a first channel terminal coupled to said control circuit, and a second channel terminal coupled to another predetermined supply potential.

7. A dynamic random access memory as recited in claim 6, wherein said single switching transistor of said switch circuit is a field effect transistor having a gate terminal directly connected to said control circuit, a first channel terminal directly connected to the predetermined supply potential, and a second channel terminal directly connected to the selected wordline.

8. A dynamic random access memory as recited in claim 7,
   wherein said control circuit comprises:
      a P-type field effect transistor having a gate terminal coupled to a first node, a first channel terminal coupled to the predetermined supply potential, and a second channel terminal coupled to a second node; and
      a N-type field effect transistor having a gate terminal coupled to the first node, a first channel terminal coupled to the second node, and a second channel terminal coupled to the first channel terminal of said first field effect transistor, and
   wherein the gate terminal of the single switching transistor of said switch circuit is coupled to the second node.

9. A dynamic random access memory as recited in claim 6, wherein said first field effect transistor of said level sense circuit is a low threshold device.

10. A dynamic random access memory as recited in claim 9, wherein the low threshold of said first field effect transistor of said level sense circuit is about 400 mV.

11. A dynamic random access memory as recited in claim 9, wherein the low threshold of said first field effect transistor of said level sense circuit is greater than a noise voltage value that would likely appear on the selected wordline.

12. A dynamic random access memory, comprising:
   a memory array having an array of memory cells, a plurality of bitlines, and a plurality of wordlines;
   an address decoder, said address decoder receives an address for a data request and selects one of the plurality of wordlines and one of the plurality of bitlines, the selected wordline having a first side and a second side;
   a line driver for driving the selected wordline at the first side; and
   a line transition accelerator circuit for detecting an initial part of a transition on the selected wordline and then accelerating the remaining part of the transition on the selected wordline from the second side, said line transition accelerator circuit comprising:
      a level sense circuit for sensing the voltage on the selected wordline and providing a voltage level signal, said level sense circuit comprising a first N-channel transistor having a gate coupled to the selected wordline, a first channel terminal for providing the voltage level signal, and a second channel terminal coupled to ground supply;
      a control circuit for providing a control signal based upon the voltage level signal and an enable signal, said control circuit comprising a first P-channel transistor and a second N-channel transistor, the first P-channel transistor having a gate coupled to an enable signal line, a first channel terminal coupled to a source of supply voltage, and a second channel terminal coupled to a first node, the second N-channel transistor having a gate coupled to the enable signal line, a first channel terminal coupled to the first node and a second channel terminal coupled to the first channel terminal of the first N-channel transistor; and
      a switch circuit for pulling the voltage on the selected wordline towards the supply voltage in response to the control signal, said switch circuit comprising a second P-channel transistor having a gate coupled to the first node for receiving the control signal, a first channel terminal coupled to the source of supply voltage, and a second channel terminal coupled to the selected wordline.

13. A dynamic random access memory as recited in claim 12, wherein said switch circuit provides only the second P-channel transistor between the selected wordline and the supply voltage.

14. A dynamic random access memory as recited in claim 12, wherein the enable signal limits the duration for which said switch circuit is able to pull the selected wordline towards the predetermined supply potential.

15. A dynamic random access memory as recited in claim 14, wherein said switch circuit provides only the second P-channel transistor between the selected wordline and the supply voltage.

16. A dynamic random access memory as recited in claim 12, wherein the first N-channel transistor of said level sense circuit is a low threshold device.

17. A dynamic random access memory as recited in claim 16, wherein the low threshold of the first N-channel transistor of said level sense circuit is about 400 mV.

18. A dynamic random access memory as recited in claim 16, wherein the low threshold of the first N-channel transistor of said level sense circuit is greater than a noise voltage value that would likely appear on the selected wordline.

* * * * *